United States Patent
Ito et al.

(10) Patent No.: US 11,469,363 B2
(45) Date of Patent: Oct. 11, 2022

(54) PIEZOELECTRIC ACTUATOR, VIBRATION GENERATING DEVICE AND ELECTRONIC EQUIPMENT

(71) Applicant: TAIYO YUDEN CO., LTD., Tokyo (JP)

(72) Inventors: Fumihisa Ito, Takasaki (JP); Yukihiro Matsui, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 703 days.

(21) Appl. No.: 16/277,767

(22) Filed: Feb. 15, 2019

(65) Prior Publication Data

US 2019/0267533 A1 Aug. 29, 2019

(30) Foreign Application Priority Data

Feb. 28, 2018 (JP) .............................. JP2018-034249

(51) Int. Cl.
*H01L 41/04* (2006.01)
*H01L 41/083* (2006.01)
(Continued)

(52) U.S. Cl.
CPC ........ *H01L 41/0475* (2013.01); *H01L 41/042* (2013.01); *H01L 41/0472* (2013.01);
(Continued)

(58) Field of Classification Search
CPC ............. H01L 41/0475; H01L 41/0472; H01L 41/042; H01L 41/053; H01L 41/083; H01L 41/0973
(Continued)

(56) References Cited

U.S. PATENT DOCUMENTS

| 6,507,140 B1* | 1/2003 | Heinz ................ H01L 41/0472 310/366 |
| 2015/0033545 A1 | 2/2015 | Morimoto et al. |
| 2015/0311423 A1* | 10/2015 | Murakami ............ H01L 41/083 310/366 |

FOREIGN PATENT DOCUMENTS

| CN | 104347924 A | 2/2015 |
| JP | 2012114212 A | 6/2012 |

(Continued)

OTHER PUBLICATIONS

A First Office Action issued by the State Intellectual Property Office of China dated Jan. 26, 2021, for Chinese counterpart application No. 201910152347.0 (8 pages).

(Continued)

*Primary Examiner* — Derek J Rosenau
(74) *Attorney, Agent, or Firm* — Law Office of Katsuhiro Arai

(57) ABSTRACT

A piezoelectric actuator 10 includes: a piezoelectric element 11; an external electrode 12 covering partially a first surface 11a of the piezoelectric element 11 in a first direction; a wiring member 14; and a conductive joining member 20 joining the wiring member 14 to the external electrode 12, wherein the conductive joining member 20 has an air gap 70 formed between the external electrode 12 and the wiring member 14 in a region overlapping with the wiring member 14 as viewed in the first direction, and wherein the conductive joining member 20 extends to an edge 21 of the external electrode 12 or extends to the first surface 11a of the piezoelectric element 11 beyond the edge 21 of the external electrode 12.

7 Claims, 9 Drawing Sheets

(51) Int. Cl.
  *H01L 41/053* (2006.01)
  *H01L 41/047* (2006.01)
  *H01L 41/09* (2006.01)
  *H04R 1/04* (2006.01)
  *H04R 17/00* (2006.01)

(52) U.S. Cl.
  CPC .......... *H01L 41/053* (2013.01); *H01L 41/083* (2013.01); *H01L 41/0973* (2013.01); *H04R 1/04* (2013.01); *H04R 17/00* (2013.01)

(58) Field of Classification Search
  USPC .................................................. 310/365, 366
  See application file for complete search history.

(56) References Cited

FOREIGN PATENT DOCUMENTS

| JP | WO2013171918 A1 | 1/2016 |
| JP | 2017005537 A | 1/2017 |
| WO | 2013171918 A1 | 11/2013 |

OTHER PUBLICATIONS

A Notice of Reasons for Refusal issued by the Japanese Patent Office, dated Jun. 28, 2022, for Japanese counterpart application No. 2018-034249. (2 pages).

\* cited by examiner

[FIG. 1]
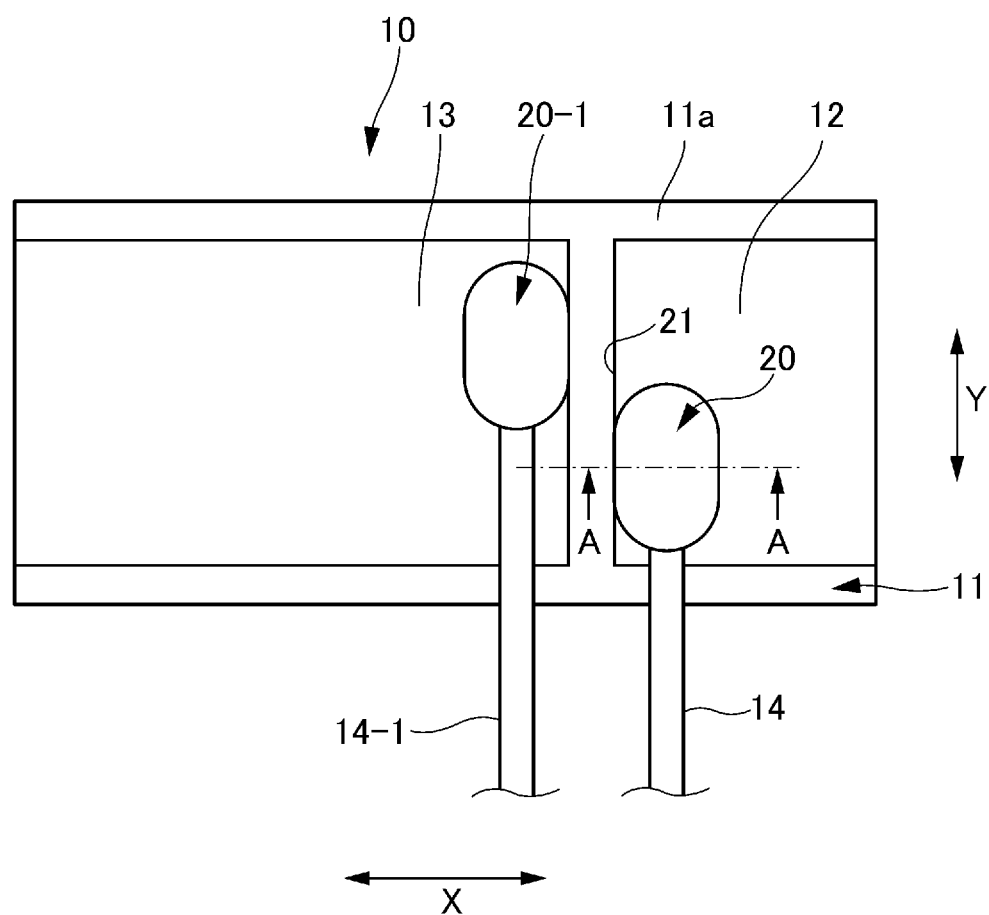

[FIG. 2]
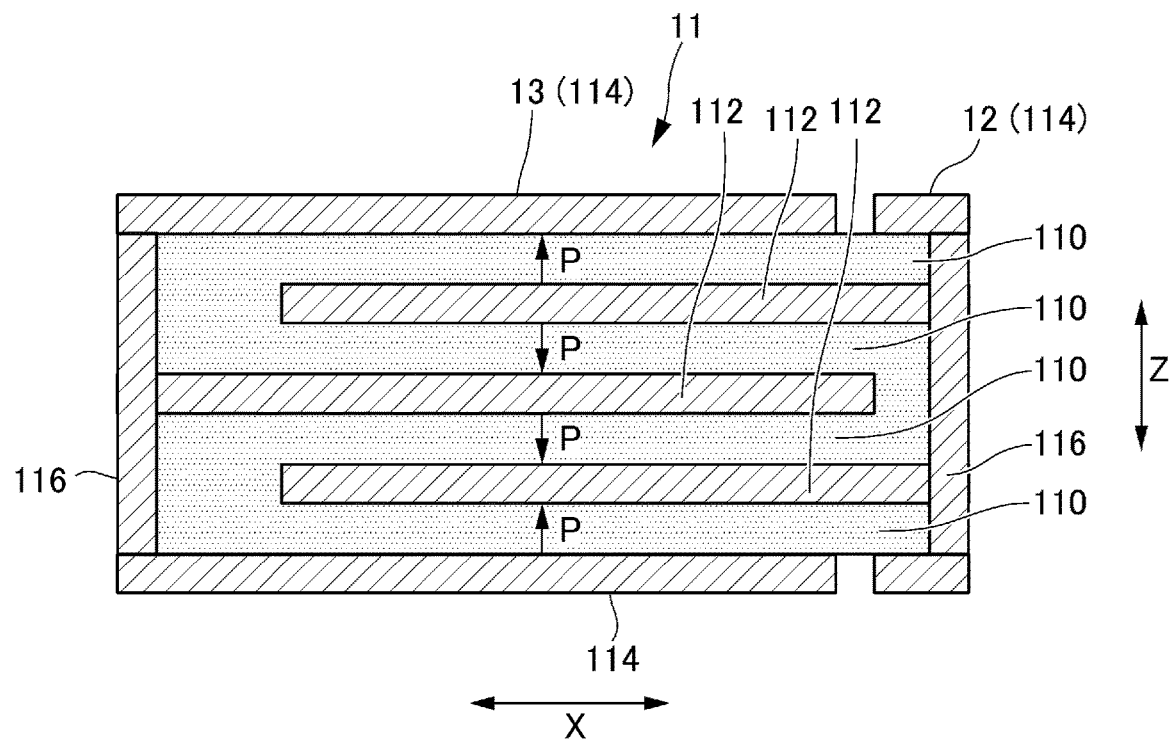
[FIG. 3]
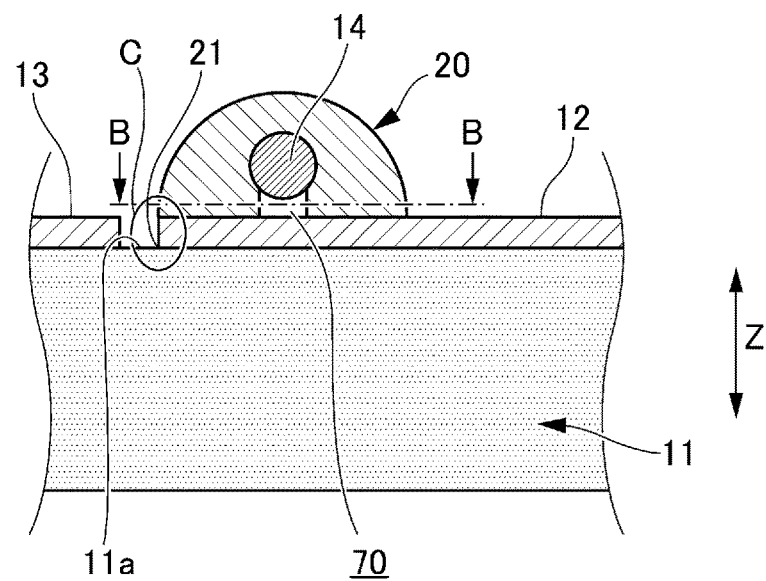

[FIG. 4A]
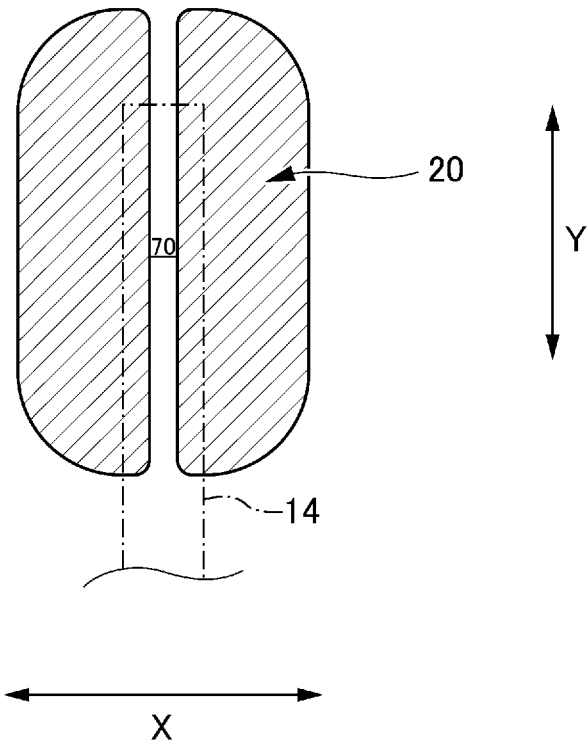
[FIG. 4B]
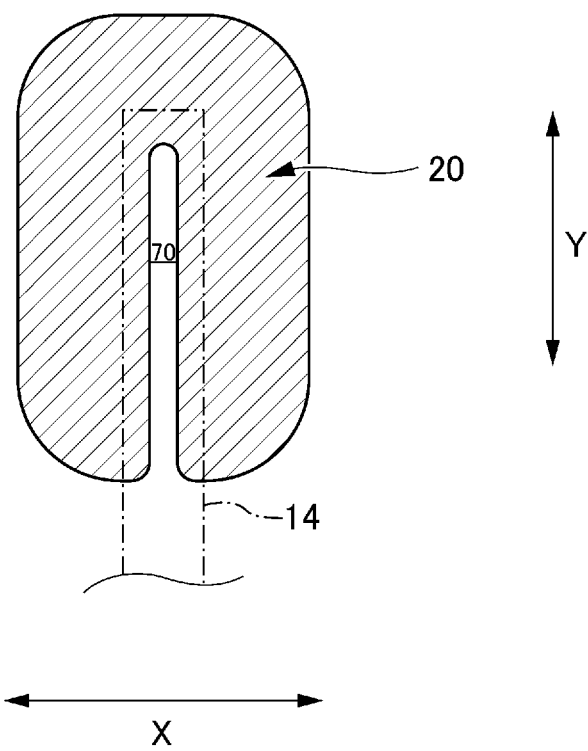

[FIG. 5]
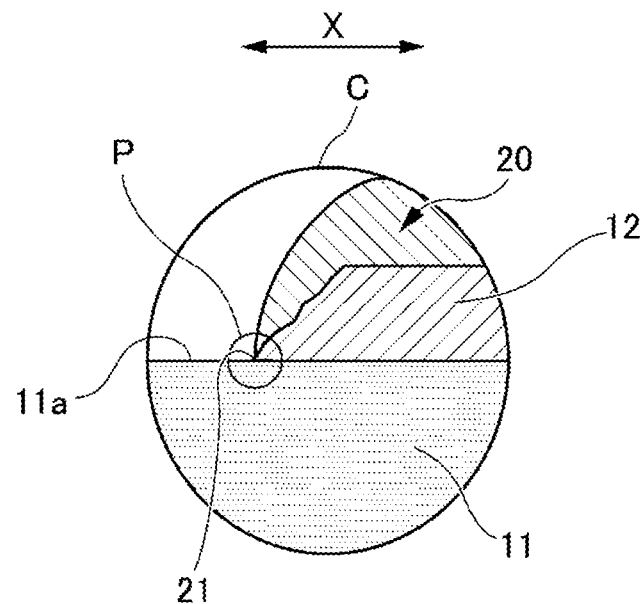
[FIG. 6A]
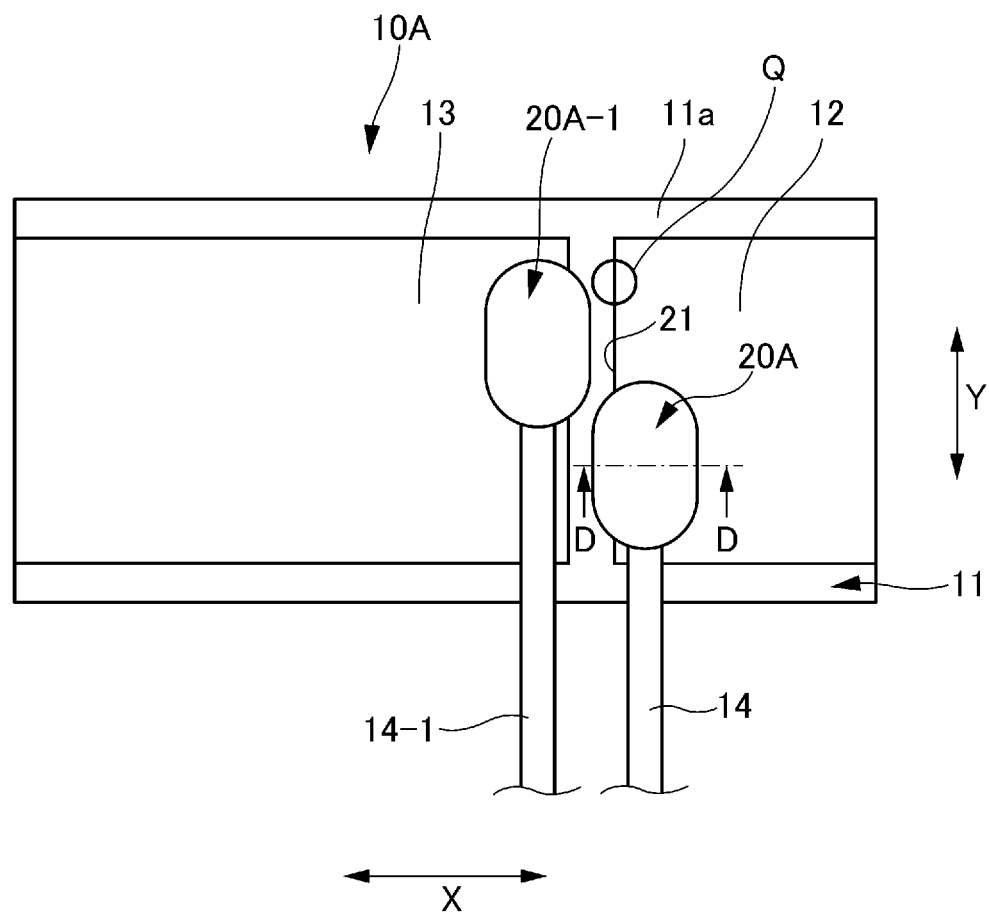

[FIG. 6B]
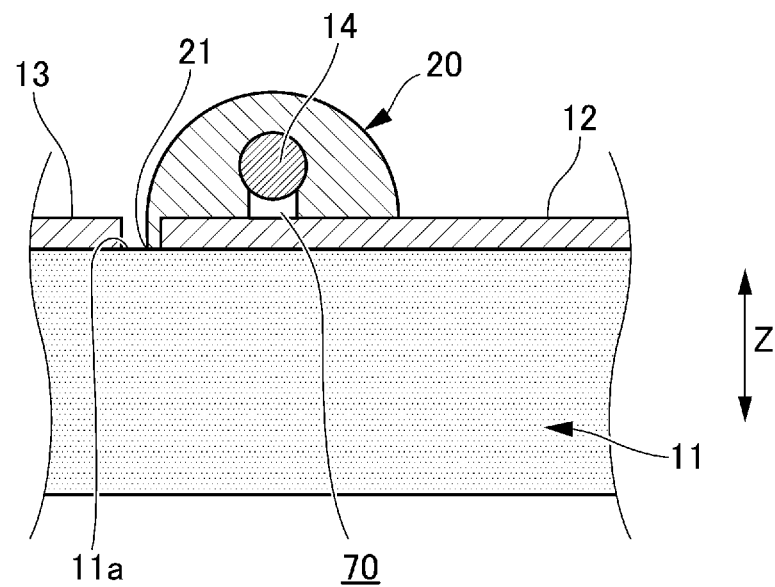
[FIG. 6C]
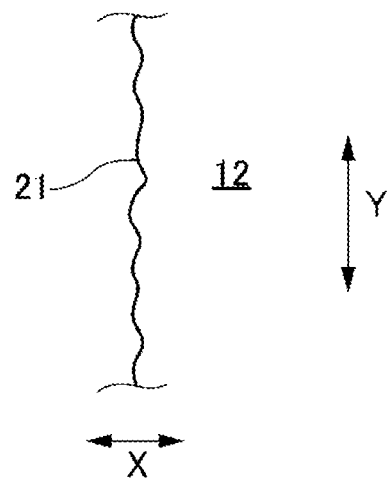

[FIG. 7]
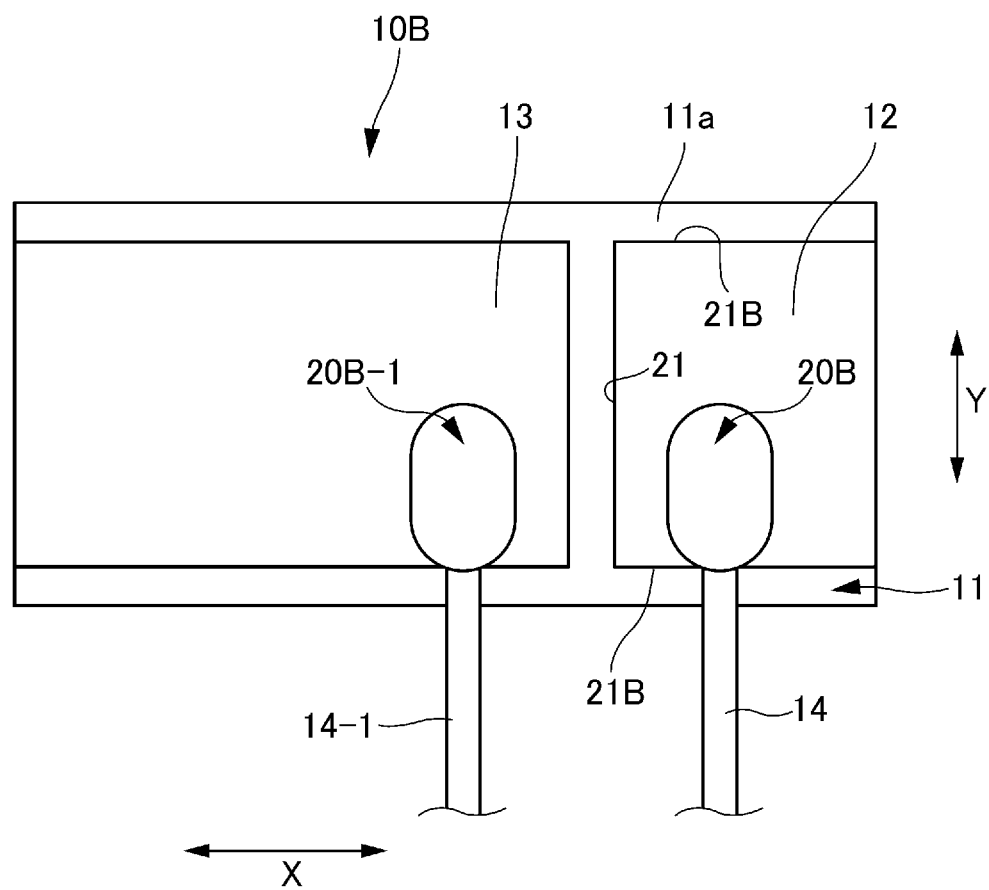

[FIG. 8]
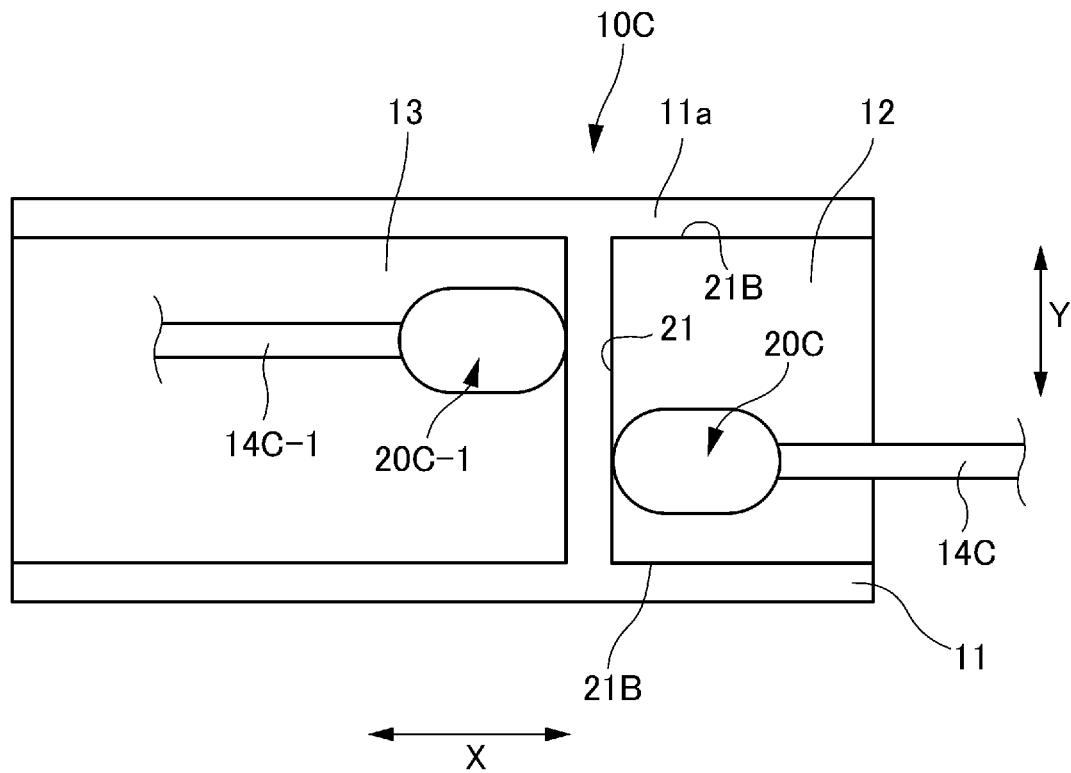
[FIG. 9]
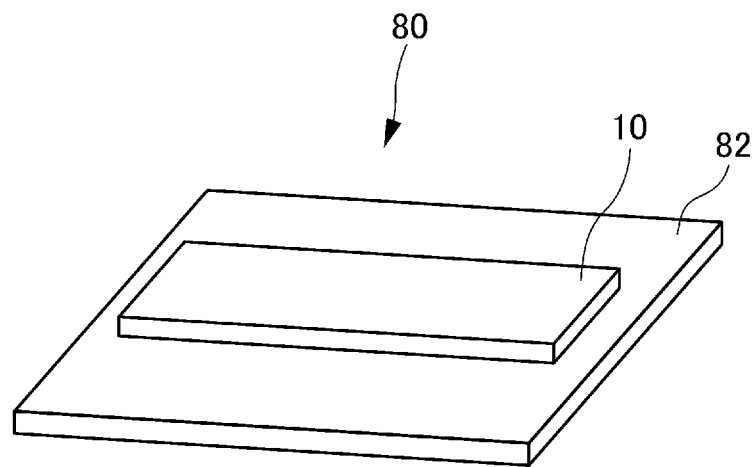

[FIG. 10A]
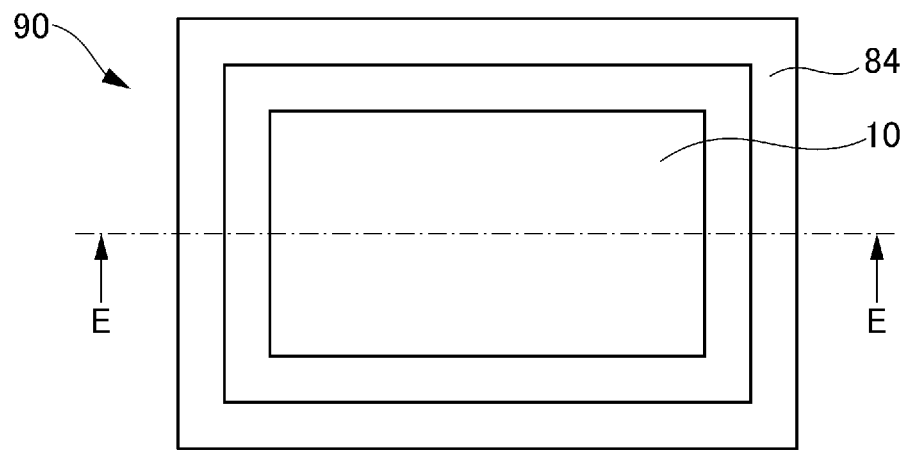
[FIG. 10B]
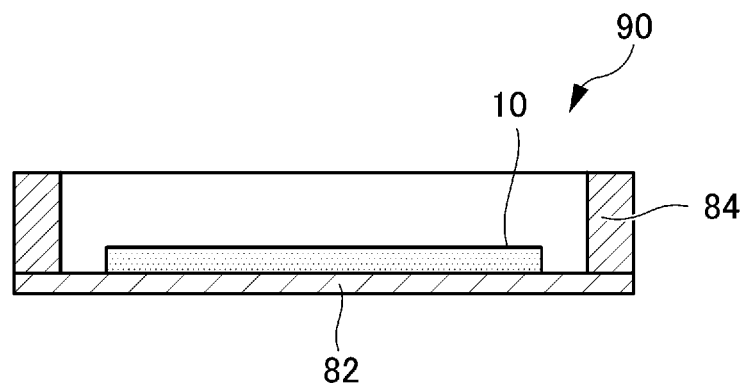
[FIG. 11A]
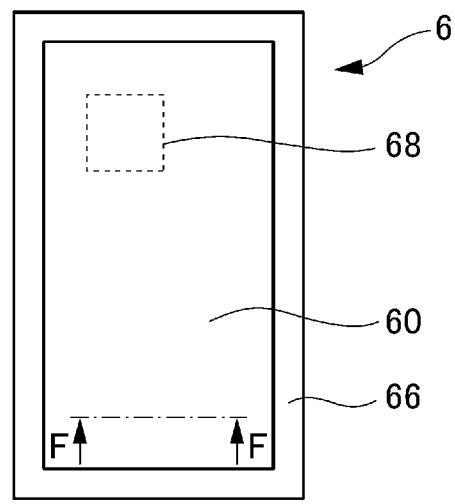

[FIG. 11B]
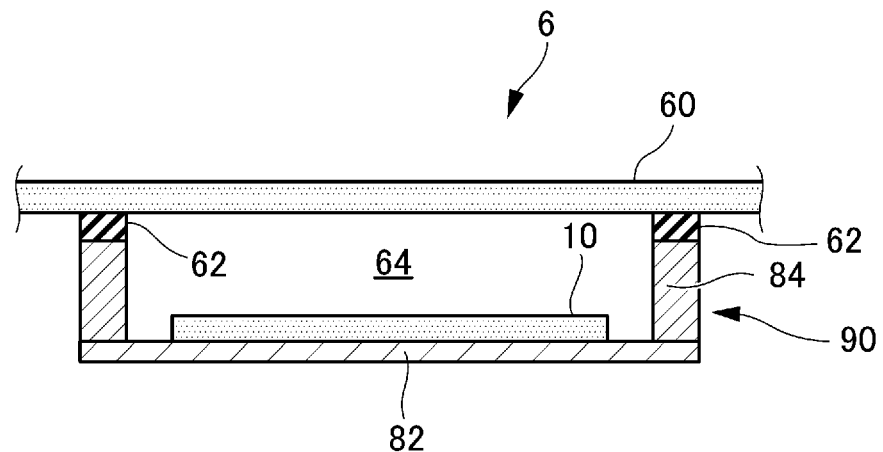

PIEZOELECTRIC ACTUATOR, VIBRATION GENERATING DEVICE AND ELECTRONIC EQUIPMENT

TECHNICAL FIELD

The present invention relates to a piezoelectric actuator, a vibration generating device and an electronic equipment.

BACKGROUND ART

There is known a piezoelectric actuator including a piezoelectric element with a surface electrode (an external electrode) on an upper surface thereof and a wiring member with an end portion electrically connected to the surface electrode via a conductive joining member, wherein an air gap surrounded by the surface electrode, the wiring member and the conductive joining member is formed in a cross section of a connecting portion between the piezoelectric element and the wiring member (for example, see Patent Literature 1).

However, in the piezoelectric actuator disclosed in the above Patent Literature 1, it is difficult to enhance adhesiveness of the conductive joining member to the external electrode while suppressing breakage of the conductive joining member to be caused by vibration of the piezoelectric element. Specifically, in the piezoelectric actuator disclosed in the above Patent Literature 1, the breakage of the conductive joining member to be caused by the vibration of the piezoelectric element can be suppressed by means of the air gap as made, but on the contrary, there is a risk that the adhesiveness of the conductive joining member to the external electrode could be decreased due to the air gap.

CITATION LIST

Patent Literature

[Patent Literature 1] Japanese Unexamined Patent Application Publication No. 2017-005537

SUMMARY OF INVENTION

Technical Problem

The present invention has been made in view of the above circumstances, and the present invention is to enhance adhesiveness of a conductive joining member to an external electrode while suppressing breakage of such conductive joining member to be caused by vibration of a piezoelectric element.

Solution to Problem

As a result of intensive studies, the inventors have found that decrease of adhesiveness to be possibly caused by providing an air gap can be reduced through an adhesiveness improvement effect that is brought from an anchor effect to be obtained by extending a conductive joining member to an edge of an external electrode or to an upper surface of a piezoelectric element beyond the edge of the external electrode, and then the present invention has been accomplished.

A piezoelectric actuator according to a first aspect of the present invention includes: a piezoelectric element; an external electrode covering partially a first surface of the piezoelectric element in a first direction; a wiring member; and a conductive joining member joining the wiring member to the external electrode, wherein the conductive joining member has an air gap formed between the external electrode and the wiring member in a region overlapping with the wiring member as viewed in the first direction, and wherein the conductive joining member extends to an edge of the external electrode or extends to the first surface of the piezoelectric element beyond the edge of the external electrode.

The edge of the external electrode may extend along a direction intersecting a longitudinal direction of the wiring member.

The air gap may extend only in a region overlapping with the external electrode as viewed in the first direction.

A vibration generating device according to a second aspect of the present invention includes: the above-described piezoelectric actuator; and a diaphragm attached to a surface opposite to the first surface of the piezoelectric element in the first direction.

The vibration generating device may further include a frame body supporting an outer peripheral portion of the diaphragm.

An electronic equipment according to a third aspect of the present invention includes: the above-described piezoelectric actuator; an electronic circuit electrically connected to the piezoelectric actuator; and a housing receiving the electronic circuit and the piezoelectric actuator.

Advantageous Effects of Invention

In accordance with the present invention, it is possible to enhance adhesiveness of a conductive joining member to an external electrode while suppressing breakage of such conductive joining member to be caused by vibration of a piezoelectric element.

BRIEF DESCRIPTION OF DRAWINGS

FIG. 1 is a schematic plan view showing a piezoelectric actuator according to a first embodiment of the present invention;

FIG. 2 is a schematic cross-sectional view showing a structure of a piezoelectric element as an example;

FIG. 3 is a cross-sectional view taken along a line A-A in FIG. 1;

FIG. 4A is a cross-sectional view taken along a line B-B in FIG. 3;

FIG. 4B is a cross-sectional view in a modified form taken along the line B-B in FIG. 3;

FIG. 5 is an enlarged schematic view showing a C-portion in FIG. 3;

FIG. 6A is a schematic plan view showing a piezoelectric actuator according to a second embodiment of the present invention;

FIG. 6B is a cross-sectional view taken along a line D-D in FIG. 6A;

FIG. 6C is an enlarged view showing a Q-portion in FIG. 6A;

FIG. 7 is a schematic plan view showing a piezoelectric actuator according to a third embodiment of the present invention;

FIG. 8 is a schematic plan view showing a piezoelectric actuator according to a fourth embodiment of the present invention;

FIG. 9 is a perspective view schematically showing a vibration generating device according to a fifth embodiment of the present invention;

FIG. 10A is a plan view schematically showing a vibration generating device according to a sixth embodiment of the present invention;

FIG. 10B is a cross-sectional view taken along a line E-E in FIG. 10A;

FIG. 11A is a plan view schematically showing an electronic equipment according to a seventh embodiment of the present invention; and FIG. 11B is a cross-sectional view taken along a line F-F in FIG. 11A.

DESCRIPTION OF EMBODIMENTS

Hereinafter, a piezoelectric actuator, a vibration generating device and an electronic equipment according to embodiments of the present invention are described with reference to the accompanying drawings.

A piezoelectric actuator according to a first embodiment of the present invention is described with reference to FIGS. 1 to 5. FIG. 1 is a schematic plan view showing a piezoelectric actuator 10 according to the first embodiment. FIG. 2 is a schematic cross-sectional view showing a structure of a piezoelectric element as an example. FIG. 3 is a cross-sectional view taken along a line A-A in FIG. 1. FIG. 4A is a cross-sectional view taken along a line B-B in FIG. 3. FIG. 4B is a cross-sectional view in a modified form taken along the line B-B in FIG. 3. FIG. 5 is an enlarged schematic view showing a C-portion in FIG. 3.

In FIG. 1, X-, Y- and Z-directions are shown as three mutually orthogonal directions. In the following description, the Z-direction corresponds to a vertical direction for the sake of explanation. However, in fact, it may correspond to any direction in accordance with a state that the piezoelectric actuator 10 is attached.

As shown in FIG. 1, the piezoelectric actuator 10 according to the first embodiment includes a piezoelectric element 11, an external electrode 12, a wiring member 14 and a conductive joining member 20. Additionally, a driving electrode 13 disposed apart from the external electrode 12 in the X-direction is illustrated in FIG. 1.

The piezoelectric element 11 is formed including ceramics with piezoelectric properties. Examples of such ceramics may include not only lead zirconate titanate but also a lead-free piezoelectric material such as lithium niobate, lithium tantalate, Bi layered compound and tungsten bronze structure compound.

The piezoelectric element 11 may have any structure, and a structure as shown in FIG. 2 may be employed, for example. In FIG. 2, the piezoelectric element 11 includes a piezoelectric layer 110 formed in four ceramics layers, an electrode laminate formed in three internal electrode layers 112 alternately laminated, surface electrodes 114 formed on one main surface (an upper surface) side and the other main surface (a lower surface) side of the electrode laminate, and side electrodes 116 formed on side surfaces of the internal electrode layers 112 which have end portions alternately exposed. In this case, the external electrode 12 and the driving electrode 13 shown in FIG. 1 are formed by the surface electrode 114 on the upper surface side of the electrode laminate. Note that the internal electrode layer 112, the surface electrode 114 and the side electrode 116 may be made of silver, a silver compound containing glass composed mainly of silica into silver, nickel or the like.

The piezoelectric element 11 according to the first embodiment has a rectangular shape in a top view, but it may have another shape (a polygonal shape, a circular shape or the like). In addition, the piezoelectric element 11 may have a unimorph structure or may have a bimorph structure as shown in FIG. 2. In the bimorph structure, as shown by P-arrows indicating polarization directions in FIG. 2, the polarization directions with respect to a direction of electric field generated when electric signals are applied to the surface electrode 114 are reversed toward one side and the other side in a thickness direction or the Z-direction. In the piezoelectric element 11 shown in FIG. 2, bending vibration is excited by applying electric signals to the surface electrode 114.

The piezoelectric actuator 10 may be obtained, for example, by preparing a slurry through mixing material powder of the piezoelectric layer 110 with an organic solvent, a binder, a plasticizer, a dispersant and the like at a predetermined ratio, making ceramic green sheets with a doctor blade method as known or the like, laminating the ceramic green sheets on the internal electrode and the external electrode, removing the binder at 500° C. in the atmosphere, and then integrally firing at 1,000° C. in the atmosphere. Not limited to the doctor blade method, the piezoelectric actuator 10 may also be obtained in another way, for example, by alternately printing and laminating a slurry containing material powder of the piezoelectric layer and a conductive paste containing an electrode material with a so-called slurry build method, and then integrally firing them.

As shown in FIG. 1, the external electrode 12 covers partially a surface 11a (hereinafter referred to as "an upper surface 11a") on an upper side in a vertical direction or the Z-direction (as an example of a first side in a first direction) of the piezoelectric element 11. Additionally, as shown in FIG. 1, the upper surface 11a of the piezoelectric element 11 is covered with the external electrode 12 and the driving electrode 13 except between the external electrode 12 and the driving electrode 13 exposed in the X-direction.

The wiring member 14 extends in the Y-direction. The wiring member 14 is electrically connected to the external electrode 12 at one end and is connected to an electronic circuit (not shown) to drive the piezoelectric actuator 10 at the other end. Although a wiring structure with respect to the driving electrode 13 (a structure of a wiring member 14-1 and a conductive joining member 20-1) is not described in detail, the wiring structure with respect to the driving electrode 13 may be similar to a wiring structure with respect to the external electrode 12 as described below.

It should be noted that the wiring member 14 may be in a form of a copper wire with coated or may be in a form of a wire drawn on a substrate such as a flexible substrate. In addition, the wiring member 14 may have a cross-sectional shape in circle as shown in FIG. 3 or another shape.

The conductive joining member 20 joins the external electrode 12 and the wiring member 14. The conductive joining member 20 is made of a material with conductivity and joinability (for example, joining properties when it is cured by reflow or the like). The conductive joining member 20 may contain a metal (for example, a silver paste or metal particles) and a resin.

As shown in FIGS. 3 and 4A (also in FIG. 4B), the conductive joining member 20 has an air gap 70 formed between the external electrode 12 and the wiring member 14 in a region overlapping with the wiring member 14 in a top view. In FIG. 4A, the wiring member 14 is indicated by an alternate long and short dash line.

The air gap 70 preferably extends only in a region overlapping with the external electrode 12 in a top view. Thereby, it is possible to prevent the anchor effect as described later from being hindered resulting from that the air gap 70 reaches a side surface of the external electrode 12. In the first embodiment, the air gap 70 is formed in conformity with a center of the wiring member 14 in the X-direction, but it may be offset to one side in the X-direction with respect to the center of the wiring member 14 in the X-direction. Further, a width of the air gap 70 in the X-direction may be equal to, smaller than or larger than the maximum width (namely, a diameter as exemplified in FIG. 3) of the wiring member 14 in the X-direction.

The air gap 70 has a function of suppressing breakage to the conductive joining member 20 to be caused by vibration of the piezoelectric element 11 during operation. That is, since the air gap 70 exists, the conductive joining member 20 is easily deformed so that stress on the conductive joining member 20 can be reduced when the piezoelectric element 11 vibrates. As a result, it is possible to suppress breakage to the conductive joining member 20 and to suppress wiring disconnection, accordingly.

Note that FIG. 4B shows the air gap 70 in another form as an example. In FIG. 4B, the air gap 70 is formed in such a manner that it does not pass through the conductive joining member 20 in the Y-direction. Besides, not limited to the air gap 70 extending in the Y-direction as above, it may also extend slantwise with respect to the Y-direction, extend in the X-direction, or extend in a plurality of independent forms. As just described, any form of the air gap 70 is applicable as long as the air gap 70 extends at least partially in a region overlapping with the wiring member 14.

The conductive joining member 20 extends to an edge 21 (see a P-portion in FIG. 5) of the external electrode 12. Here, "an edge" refers to an outermost position (a point in a cross-sectional view). For example, as schematically shown in FIG. 5, the conductive joining member 20 extends to an end portion (a contact point with the upper surface 11a) of the side surface of the external electrode 12 (a side surface becoming thinner outwardly as exemplified in FIG. 5). Here, the side surface of the external electrode 12 becomes thinner toward the edge 21 and tends to be in a concavo-convex shape when manufacturing. Therefore, by extending the conductive joining member 20 covering the side surface of the external electrode 12, it is possible to expect the anchor effect on the side surface of the external electrode 12. In this manner, it is possible to enhance joining force between the external electrode 12 and the conductive joining member 20.

By the way, when the air gap 70 is formed as described above, a joined area between the external electrode 12 and the conductive joining member 20 is smaller as compared with a case when the air gap 70 is not formed, and then adhesiveness of the conductive joining member 20 to the external electrode 12 tends to be decreased.

In this regard, according to the first embodiment, the conductive joining member 20 extends to the edge 21 of the external electrode 12 as described above. Thereby, it is possible to enhance the joining force between the external electrode 12 and the conductive joining member 20. In this manner, according to the first embodiment, while suppressing breakage to the conductive joining member 20 by forming the air gap 70 as described above, it is possible to enhance adhesiveness of the conductive joining member 20 to the external electrode 12 by extending the conductive joining member 20 to the edge 21 of the external electrode 12.

Next, piezoelectric actuators according to other embodiments are described. In the description of other embodiments, the details of constituent elements that may be the same as the above-described first embodiment are omitted by assigning the same reference signs thereto.

FIG. 6A is a schematic plan view showing a piezoelectric actuator 10A according to a second embodiment. FIG. 6B is a cross-sectional view taken along a line D-D in FIG. 6A. FIG. 6C is an enlarged view showing a Q-portion in FIG. 6A.

As shown in FIG. 6A, the piezoelectric actuator 10A according to the second embodiment includes the piezoelectric element 11, the external electrode 12, the wiring member 14 and a conductive joining member 20A.

Unlike the conductive joining member 20 according to the above-described first embodiment, the conductive joining member 20A extends to the upper surface 11a of the piezoelectric element 11 beyond the edge 21 of the external electrode 12. Not surprisingly, the conductive joining member 20A does not extend to the driving electrode 13.

Like the above-described conductive joining member 20, the conductive joining member 20A has the air gap (not shown) formed between the external electrode 12 and the wiring member 14 in a region overlapping with the wiring member 14 in a top view.

Even with the piezoelectric actuator 10A according to the second embodiment, it is possible to achieve the effects similar to those of the piezoelectric actuator 10 according to the above-described first embodiment. In particular, according to the piezoelectric actuator 10A, since a joined area with the side surface of the external electrode 12 is added as compared with the piezoelectric actuator 10 according to the above-described first embodiment, it is possible to further enhance adhesiveness correspondingly.

Here, the edge of the external electrode 12 tends to extend in a concavo-convex shape in a top view when manufacturing. That is, when the external electrode 12 is formed by screen printing or the like, pattern marks of a screen are generated microscopically along the edge (the edge is not exactly formed in a clean straight line). For example, as shown in FIG. 6C, the edge 21 extends along the Y-direction while becoming in a concavo-convex shape in the X-direction. Therefore, by extending the conductive joining member 20 beyond the edge 21 of the external electrode 12, it is possible to expect the anchor effect using a concavo-convex shape along the edge 21 of the external electrode 12. In this manner, it is possible to enhance joining force between the external electrode 12 and the conductive joining member 20A.

As exemplified in FIG. 6A, a wiring structure with respect to the driving electrode 13 (a structure of a conductive joining member 20A-1 and the wiring member 14-1) is configured similarly. That is, the conductive joining member 20A-1 extends to the upper surface 11a of the piezoelectric element 11 beyond an edge of the driving electrode 13 (an edge facing the external electrode 12 in the X-direction). In this case, as shown in FIG. 6A, the conductive joining member 20A and the conductive joining member 20A-1 may be offset in the Y-direction so that the conductive joining member 20A and the conductive joining member 20A-1 are not in contact with each other.

FIG. 7 is a schematic plan view showing a piezoelectric actuator 10B according to a third embodiment.

As shown in FIG. 7, the piezoelectric actuator 10B according to the third embodiment includes the piezoelectric element 11, the external electrode 12, the wiring member 14 and a conductive joining member 20B.

Unlike the conductive joining member 20 according to the above-described first embodiment, the conductive joining member 20B extends to an edge 21B of the external electrode 12 in the Y-direction. As exemplified in FIG. 7, the conductive joining member 20B extends to the edge 21B located on a lead-out side of the wiring member 14 among both sides of the external electrode 12 of the conductive joining member 20B in the Y-direction. However, the same configuration may also be realized on an opposite edge 21B. Further, like the second embodiment shown in FIGS. 6A and 6B, the conductive joining member 20B may extend to the upper surface 11a of the piezoelectric element 11 beyond the edge 21B of the external electrode 12 in the Y-direction (beyond the lead-out side of the wiring member 14).

Like the above-described conductive joining member 20, the conductive joining member 20B has the air gap (not shown) formed between the external electrode 12 and the wiring member 14 in a region overlapping with the wiring member 14 in a top view.

Even with the piezoelectric actuator 10B according to the third embodiment, it is possible to achieve the effects similar to those of the piezoelectric actuator 10 according to the above-described first embodiment.

As exemplified in FIG. 7, a wiring structure with respect to the driving electrode 13 (a structure of a conductive joining member 20B-1 and the wiring member 14-1) is configured similarly. That is, the conductive joining member 20B-1 extends to an edge of the driving electrode 13 (an edge located on the lead-out side of the wiring member 14-1 in the Y-direction).

In the third embodiment, the conductive joining member 20B extends to the edge 21B of the external electrode 12 in the Y-direction on the lead-out side of the wiring member 14. However, it is not limited thereto. The conductive joining member 20B may also extend to the edge 21B of the external electrode 12 in the Y-direction on a side opposite to the lead-out side of the wiring member 14. Further, the conductive joining member 20B may also extend beyond the edge 21B of the external electrode 12 in the Y-direction on the lead-out side of the wiring member 14.

Further, the third embodiment can be combined with the above-described first embodiment. That is, the conductive joining member 20B may further extend to the edge 21 of the external electrode 12 in the X-direction on a side facing the driving electrode 13 in the X-direction.

FIG. 8 is a schematic plan view showing a piezoelectric actuator 10C according to a fourth embodiment.

As shown in FIG. 8, the piezoelectric actuator 10C according to the fourth embodiment includes the piezoelectric element 11, the external electrode 12, a wiring member 14C and a conductive joining member 20C.

Unlike the wiring member 14 according to the above-described first embodiment, the wiring member 14C extends in the X-direction.

Unlike the conductive joining member 20 according to the above-described first embodiment, the conductive joining member 20C extends to the edge 21 of the external electrode 12 in the X-direction on a side opposite to a lead-out side of the wiring member 14C.

Like the above-described conductive joining member 20, the conductive joining member 20C has the air gap (not shown) formed between the external electrode 12 and the wiring member 14C in a region overlapping with the wiring member 14C in a top view.

Even with the piezoelectric actuator 10C according to the fourth embodiment, it is possible to obtain effects similar to those of the piezoelectric actuator 10 according to the above-described first embodiment.

As exemplified in FIG. 8, a wiring structure with respect to the driving electrode 13 (a structure of a conductive joining member 20C-1 and a wiring member 14C-1) is configured similarly. That is, the conductive joining member 20C-1 extends to an edge of the driving electrode 13 (an edge facing the external electrode 12 in the X-direction) on a side opposite to the lead-out side of the wiring member 14C-1.

In the fourth embodiment, the conductive joining member 20C extends to the edge 21 of the external electrode 12 in the Y-direction. However, like the above-described second embodiment, the conductive joining member 20C may also extend to the upper surface 11a of the piezoelectric element 11 beyond the edge 21 of the external electrode 12 in the Y-direction. Further, the conductive joining member 20C may also extend to the edge 21B of the external electrode 12 in the Y-direction on either side in the Y-direction, or may also extend to the upper surface 11a of the piezoelectric element 11 beyond the edge 21B of the external electrode 12 in the Y-direction.

Next, with reference to FIG. 9 and subsequent figures, a vibration generating device and an electronic equipment using the piezoelectric actuator 10 are described.

FIG. 9 is a perspective view schematically showing a vibration generating device according to a fifth embodiment of the present invention.

In FIG. 9, a vibration generating device 80 is embodied as a piezoelectric vibration device.

The vibration generating device 80 includes the piezoelectric actuator 10 and a diaphragm 82.

The piezoelectric actuator 10 is as described above. The piezoelectric actuator 10A, the piezoelectric actuator 10B and others may also be employed in place of the piezoelectric actuator 10.

The diaphragm 82 is a plate that generates vibration by driving the piezoelectric actuator 10. The diaphragm 82 has a rectangular shape, for example, but any shape is applicable. The diaphragm 82 may be made of a material with relatively high rigidity such as acrylic resin or glass. A lower surface of the piezoelectric element 11 of the piezoelectric actuator 10 is attached to the diaphragm 82. The piezoelectric element 11 is attached to the diaphragm 82 via a joining member (not shown), for example. The joining member may be formed, for example, in a double-sided tape having adhesive layers adhered to both surfaces of a substrate such as a nonwoven fabric, or in an elastic adhesive. The piezoelectric actuator 10 may be attached on any position of the diaphragm 82, and, for example, it may be aligned with respect to a center of the diaphragm 82 as shown in FIG. 9 or may be offset from the center of the diaphragm 82.

When electric signals are applied to the vibration generating device 80, the piezoelectric element 11 performs bending vibration. As a result, the diaphragm 82 vibrates.

Since the vibration generating device 80 includes the piezoelectric actuator 10 in which breakage to the conductive joining member 20 is suppressed and adhesiveness of the conductive joining member 20 to the external electrode 12 is enhanced, the vibration generating device 80 is excellent in long-term reliability.

FIG. 10A is a plan view schematically showing a vibration generating device according to a sixth embodiment of the present invention. FIG. 10B is a cross-sectional view taken along a line E-E in FIG. 10A.

A vibration generating device 90 includes the piezoelectric actuator 10, the diaphragm 82 and a frame body 84.

The piezoelectric actuator 10 is as described above with reference to FIG. 1 and others. The piezoelectric actuator 10A, the piezoelectric actuator 10B and others may also be employed in place of the piezoelectric actuator 10. The diaphragm 82 is as described above with reference to FIG. 9.

The frame body 84 extends along an outer peripheral portion of the diaphragm 82. The frame body 84 is fixed to the outer peripheral portion of the diaphragm 82. More specifically, the frame body 84 is fixed to the outer peripheral portion of the diaphragm 82 in a state that tension is applied to the diaphragm 82. The diaphragm 82 vibrates together with the piezoelectric actuator 10 through vibration of the piezoelectric actuator 10.

The frame body 84 functions as a support body to support the diaphragm 82. The frame body 84 may be made of metal such as stainless steel or resin, for example. It should be noted that a weight or the like may be further provided on the diaphragm 82. Furthermore, a second frame body (not shown) may also be provided on the diaphragm 82 on a side opposite to the frame body 84.

In FIGS. 10A and 10B, the piezoelectric actuator 10 is attached to a side where the frame body 84 is provided on the diaphragm 82. However, it may be reversed. That is, the frame body 84 may be provided on a side opposite to the side where the piezoelectric actuator 10 is attached.

FIG. 11A is a plan view schematically showing an electronic equipment according to a seventh embodiment of the present invention. FIG. 11B is a cross-sectional view taken along a line F-F in FIG. 11A.

The electronic equipment 6 includes the piezoelectric actuator 10, the diaphragm 82, the frame body 84, a display panel 60, a housing 66 and an electronic circuit 68.

The electronic equipment 6 is configured in any type and, for example, it may be a mobile terminal such as a smartphone as shown in FIG. 11A. Besides, the electronic equipment 6 may be a controller of a game machine, a wearable device, a tablet terminal, a portable music player or the like. Further, the electronic equipment 6 may be embodied as an in-vehicle electronic equipment. Furthermore, the electronic device 6 may be embodied as a household electronic equipment (a television, a vacuum cleaner, a washing machine, a refrigerator, a microwave oven, etc.).

The piezoelectric actuator 10 is as described above with reference to FIG. 1 and others. The diaphragm 82 and the frame body 84 are as described above with reference to FIGS. 9, 10A, and 10B.

The display panel 60 may be, for example, a liquid crystal display panel or an organic EL (Electro Luminescence) display panel. A glass panel or the like with no display function may also be employed in place of the display panel 60.

The housing 66 is a housing of the electronic equipment 6. Inside the housing 66, the electronic circuit 68 (schematically shown by a dotted line in FIG. 11A), the vibration generating device 90 and the like are received.

The electronic circuit 68 is electrically connected to the piezoelectric actuator 10. The electronic circuit 68 applies electric signals for driving the piezoelectric actuator 10 to the piezoelectric actuator 10. The piezoelectric actuator 10 may be driven under control of a controller including the electronic circuit 68.

As shown in FIG. 11B, the vibration generating device 90 as described above with reference to FIGS. 10A and 10B is attached to the display panel 60 via a joining member 62. Specifically, the frame body 84 is connected to an inner surface of the display panel 60 via the joining member 62. The joining member 62 may be formed in a double-sided tape having adhesive layers adhered to both surfaces of a substrate such as a nonwoven fabric, or in a foam body. Thereby, a space 64 surrounded by the display panel 60, the diaphragm 82, and the frame body 84 is formed. The space 64 may be in an enclosed state or may be communicated with a space inside the housing 66 through a hole provided in the diaphragm 82 or the like. In addition, a rubber material, a resin (a foamed resin), silicone or the like may be filled in a part or the whole of the space 64.

In this case, the vibration generating device 90 may function as an acoustic speaker, or a tactile presentation device (for example, a force feedback device) that presents a tactile sense to a user through vibration or the like via the display panel 60. When the vibration generating device 90 functions as an acoustic speaker, a sound hole may be formed in the display panel 60. Alternatively, the vibration generating device 90 may be provided so as to face a frame region of the electronic equipment 6 (a region surrounding the display panel 60 in the housing 66).

In a case where the piezoelectric element 11 has a bimorph structure and the vibration generating device 90 functions as an acoustic speaker, it is possible to make thinner the vibration generating device 90 and efficiently vibrate the diaphragm 82 with less energy. In addition, since the piezoelectric element 11 itself performs bending vibration, it is possible to contribute to an improvement in sound pressure through reducing mechanical loss at a surface joined with the diaphragm 82.

REFERENCE SIGNS LIST

6 . . . electronic equipment;
10 . . . piezoelectric actuator;
10A . . . piezoelectric actuator;
10B . . . piezoelectric actuator;
10C . . . piezoelectric actuator;
11 . . . piezoelectric element;
11a . . . upper surface;
12 . . . external electrode;
13 . . . driving electrode;
14 . . . wiring member;
14C . . . wiring member;
14C-1 . . . wiring member;
20 . . . conductive joining member;
20A . . . conductive joining member;
20A-1 . . . conductive joining member;
20B . . . conductive joining member;
20B-1 . . . conductive joining member;
20C . . . conductive joining member;
20C-1 . . . conductive joining member;
21 . . . edge;
21B . . . edge;
60 . . . display panel;
62 . . . joining member;
64 . . . space;
66 . . . housing;
68 . . . electronic circuit;
70 . . . air gap;
80 . . . vibration generating device;
82 . . . diaphragm;
84 . . . frame body;
90 . . . vibration generating device;
110 . . . piezoelectric layer;
112 . . . internal electrode layer;
114 . . . surface electrode; and
116 . . . side electrode.

The invention claimed is:

1. A piezoelectric actuator comprising:
   a piezoelectric element;
   a pair of external electrodes covering partially a first surface of the piezoelectric element in a first direction;
   a pair of wiring members; and a pair of conductive joining members joining the pair of wiring members, respectively, to the pair of external electrodes, respectively, wherein the conductive joining members are apart from each other without overlapping each other as viewed in the first direction, said conductive joining members having adjacent sides facing each other, wherein the conductive joining members each have an air gap formed between the corresponding external electrode and the corresponding wiring member in a region overlapping with the wiring member as viewed in the first direction, and wherein each of the conductive joining members extends, on each of the adjacent sides, to the first surface of the piezoelectric element beyond the edge of each of the external electrodes.

2. The piezoelectric actuator according to claim 1, wherein the edge of the external electrode extends along a direction intersecting a longitudinal direction of the wiring member.

3. The piezoelectric actuator according to claim 1, wherein the air gap extends only in a region overlapping with the external electrode as viewed in the first direction.

4. A vibration generating device comprising:
a piezoelectric actuator according to claim 1; and
a diaphragm attached to a surface opposite to the first surface of the piezoelectric element in the first direction.

5. The vibration generating device according to claim 4, further comprising a frame body supporting an outer peripheral portion of the diaphragm.

6. An electric equipment comprising:
a piezoelectric actuator according to claim 1;
an electronic circuit electrically connected to the piezoelectric actuator; and
a housing receiving the electronic circuit and the piezoelectric actuator.

7. The vibration generating device according to claim 1, wherein each of the wiring members has an end above the corresponding external electrode, and each of the conductive joining members encloses and covers the end of the corresponding wiring member, as viewed from above in the first direction.

* * * * *